US011402420B2

(12) United States Patent
Hu et al.

(10) Patent No.: US 11,402,420 B2
(45) Date of Patent: Aug. 2, 2022

(54) CAPACITOR TESTING DEVICE AND TESTING METHOD THEREOF

(71) Applicant: SUZHOU APPARATUS SCIENCE ACADEMY CO., LTD., Jiangsu (CN)

(72) Inventors: Delin Hu, Jiangsu (CN); Chun Hu, Jiangsu (CN); Min Zhang, Jiangsu (CN); Fengya Chen, Jiangsu (CN); Yitian Guan, Jiangsu (CN); Zhigang Xu, Jiangsu (CN); Xiaolei Xu, Jiangsu (CN); Hui Zhu, Jiangsu (CN)

(73) Assignee: SUZHOU APPARATUS SCIENCE ACADEMY CO., LTD., Jiangsu (CN)

( * ) Notice: Subject to any disclaimer, the term of this patent is extended or adjusted under 35 U.S.C. 154(b) by 0 days.

(21) Appl. No.: 17/291,147

(22) PCT Filed: Nov. 8, 2018

(86) PCT No.: PCT/CN2018/114466
§ 371 (c)(1),
(2) Date: May 4, 2021

(87) PCT Pub. No.: WO2020/093293
PCT Pub. Date: May 14, 2020

(65) Prior Publication Data
US 2021/0373062 A1  Dec. 2, 2021

(30) Foreign Application Priority Data

Nov. 6, 2018 (CN) .......................... 201811315723.5

(51) Int. Cl.
*G01R 31/12* (2020.01)
*G01R 31/01* (2020.01)
(52) U.S. Cl.
CPC ................ *G01R 31/016* (2013.01)

(58) Field of Classification Search
CPC .... G01R 31/016; G01R 31/013; G01N 21/88; G01N 21/8806; G01N 21/8841;
(Continued)

(56) References Cited

U.S. PATENT DOCUMENTS

| 6,493,079 | B1 * | 12/2002 | Piacentini | ............... G06T 7/001 356/240.1 |
| 6,959,108 | B1 * | 10/2005 | Bartelt | ................. G01N 21/952 850/10 |
| 2003/0197500 | A1 | 10/2003 | Saulnier et al. | |

FOREIGN PATENT DOCUMENTS

| CN | 201859191 U | 6/2011 |
| CN | 103477237 A | 12/2013 |

(Continued)

*Primary Examiner* — Thang X Le
(74) *Attorney, Agent, or Firm* — Muncy, Geissler, Olds & Lowe, P.C.

(57) ABSTRACT

A capacitor testing device includes a carrier with a plurality of clamping holes which are configured to carry capacitors to be tested; a conveying means being configured to convey the carrier; an image collection assembly, including an upper image collection assembly disposed above the conveying means and a lower image collection assembly disposed below the conveying means, the upper image collection assembly and the lower image collection assembly being configured to perform defect testing on outer surfaces of the capacitors to be tested; and a performance testing means, including a performance testing circuit board and a lifting assembly being configured to drive the performance testing circuit board to ascend or descend, and the performance testing means being configured to test electrical performances of the capacitors to be tested.

10 Claims, 4 Drawing Sheets

(58) Field of Classification Search
CPC ............ G01N 21/8845; G01N 21/8851; G06T 7/001; G06T 2207/30141
See application file for complete search history.

(56) References Cited

FOREIGN PATENT DOCUMENTS

| | | | |
|---|---|---|---|
| CN | 104849500 | A | 8/2015 |
| CN | 105044114 | A | 11/2015 |
| CN | 204789357 | U | 11/2015 |
| CN | 206113866 | U | 4/2017 |
| CN | 107860777 | A | 3/2018 |
| CN | 207779917 | * | 8/2018 |

* cited by examiner

CAPACITOR TESTING DEVICE AND TESTING METHOD THEREOF

TECHNICAL FIELD

The present invention relates to the technical field of capacitors, in particular to a capacitor testing device and a testing method thereof.

BACKGROUND

Among electronic parts, a capacitor is an element capable of storing charges, and is also one of the most common electronic elements.

Capacitors need to be tested in various ways after production, such as electric leakage testing, the existing method of which is to handle an instrument manually and clamp a testing clamp on the instrument onto an electrode for testing. Such method is cumbersome in operation and inefficient. Meanwhile, in the production process of a capacitor, surface defects such as bushing cracking, bubbling and scratching often occur on the surface of the capacitor. At present, the appearance of the capacitor is generally tested manually, such testing is inefficiency, and testing quality cannot be ensured.

SUMMARY

In order to solve the above technical problems, the present invention provides a capacitor testing device and a testing method thereof.

In order to achieve the above objective, the technical solution of the present invention is as follows:

A capacitor testing device, including:

a carrier with a plurality of clamping holes which are configured to carry capacitors to be tested;

a conveying means being configured to convey the carrier;

an image collection assembly, including an upper image collection assembly disposed above the conveying means and a lower image collection assembly disposed below the conveying means, the upper image collection assembly and the lower image collection assembly being configured to perform defect testing on outer surfaces of the capacitors to be tested; and a performance testing means, including a performance testing circuit board and a lifting assembly being configured to drive the performance testing circuit board to ascend or descend, and the performance testing means being configured to test electrical performances of the capacitors to be tested.

The capacitor testing device disclosed by the present invention is simple in structure and convenient to operate, and can quickly and effectively test the electrical performances (such as including whether there is electric leakage, whether there is short circuit, and specific capacitance values) of the capacitors and the surfaces of the capacitors. In addition, the testing process is semi-automated or automated, which reduces manual intervention and labor force, and improves testing precision and testing speed.

On the basis of the above technical solution, the following improvements may also be made:

As a preferred solution, the plurality of clamping holes are distributed in a matrix on the carrier.

In the above preferred solution, the testing effect is better. Meanwhile, an elastic layer may be attached to inner walls of the clamping holes to protect the outer surfaces of the capacitors.

As a preferred solution, each of the upper image collection assembly and the lower image collection assembly includes a plurality of image collectors disposed in a row, and the number of the image collectors in the upper image collection assembly and the number of the image collectors of the lower image collection assembly are the same as the number of one row of clamping holes on the carrier.

In the above preferred solution, defect testing can be performed on the upper and lower of one row of capacitors simultaneously, with high testing precision and testing speed.

As a preferred solution, the capacitor testing device further includes a rejection assembly being configured to reject a defective tested capacitor; and the rejection assembly includes a rejection mechanical arm, an adsorption plate disposed on the rejection mechanical arm and one or more adsorption holes formed on the adsorption plate, and the adsorption holes communicating with a vacuumizing means through an adsorption channel inside the adsorption plate, and the rejection mechanical arm being configured to drive actions of the adsorption plate.

In the above preferred solution, the rejection mechanical arm being configured to drive actions of the adsorption plate, and defective capacitors are adsorbed for rejection through the adsorption holes.

As a preferred solution, when the adsorption plate is provided with a plurality of adsorption holes, the plurality of adsorption holes are disposed in a row, and the number of the adsorption holes is the same as the number of one row of clamping holes on the carrier.

In the above preferred solution, a plurality of adsorption channels are disposed inside the adsorption plate, each adsorption channel is provided with a valve being configured to open and close the adsorption channel. Each adsorption hole communicates with the vacuumizing means through an adsorption channel corresponding thereto inside the adsorption plate. When a certain capacitor needs to be rejected, the valve of the corresponding adsorption channel is opened, and the capacitor is adsorbed for rejection through the corresponding adsorption hole.

As a preferred solution, the capacitor testing device further includes light source assemblies being configured to illuminate the capacitors to be tested; and the light source assemblies are disposed on two sides of the upper image collection assembly and/or the lower image collection assembly.

In the above preferred solution, the light source assemblies provide light sources to ensure the accuracy of capacitor image collection.

As a preferred solution, the conveying means is provided with connecting plates rotatably connected with the light source assemblies.

In the above preferred solution, the light source assemblies can be effectively and stably fixed, and meanwhile, angles of the light assemblies are adjustable to provide sufficient illumination for the image collection assembly, so as to accurately collect images.

As a preferred solution, each of the upper image collection assembly and the lower image collection assembly is disposed on an adjustment assembly, and the adjustment assemblies being configured to adjust the upper, lower, left and right positions of the upper image collection assembly and lower image collection assembly.

In the above preferred solution, the upper, lower, left and right positions of the upper image collection assembly and lower image collection assembly can be effectively adjusted to ensure that the upper image collection assembly and the lower image collection assembly can accurately collect images.

A capacitor testing method using the capacitor testing device for testing capacitors specifically includes the following steps:

1) arranging capacitors to be tested in the clamping holes of the carrier one by one;

2) arranging the carrier on the conveying means;

3) conveying, by the conveying means, the carrier to a testing work position;

4) driving, by the lifting assembly, the performance testing circuit board to ascend until testing contacts on the performance testing circuit board contact the capacitors to be tested on the carrier, and testing, by the performance testing circuit board, electrical performances of the capacitors;

5) after completion of testing of the electrical performances, driving, by the lifting assembly, the performance testing circuit board to return to an original position;

6) performing, by the upper image collection assembly and the lower image collection assembly, defect testing simultaneously on outer surfaces of the capacitors to be tested; and 7) after completion of the defect testing, conveying, by the conveying means, the carrier to a subsequent work position.

The capacitor testing method according to the present invention has simple operation steps, is high in testing precision and testing speed, is suitable for testing a large quantity of capacitors, and substantially reduces manual labor force.

As a preferred solution, each of the upper image collection assembly and the lower image collection assembly includes a plurality of image collectors disposed in a row, and the number of the image collectors in the upper image collection assembly and the number of the image collectors of the lower image collection assembly are the same as the number of one row of clamping holes on the carrier, and each image collector has its unique code;

step 6) is specifically as follows:

6.1) performing, by the upper image collection assembly and the lower image collection assembly, image collection simultaneously on outer surfaces of the capacitors to be tested;

6.2) binding, by each of the image collectors, its own code with a collected original image, and sending the bound image to a processor;

6.3) positioning and segmenting, by the processor, an original image according to code information to extract partial images of a capacitor to be tested;

6.4) matching, by the processor, the partial images of the capacitor to be tested with images in a non-defective capacitor image library one by one;

if one of the images is successfully matched, determining that the capacitor is non-defective; and if none of the images is successfully matched, determining that the capacitor is defective, and proceeding to step 6.5);

6.5) matching, by the processor, the partial images of the capacitor to be tested with images in a defective capacitor image library one by one to determine that the partial images have higher matching degrees with which one or more images in the defective capacitor image library and as well as the corresponding image matching degree(s); and 6.6) obtaining, by the processor, a defect testing score according to the formula below:

$$C=100-(a_1*S_1+\ldots+a_i*S_1+\ldots a_j*S_1)-\ldots-(a_1*S_i+\ldots+a_i*S_i+\ldots a_j*S_i)-(a_1*S_n+\ldots+a_i*S_n+\ldots a_j*S_n);$$

wherein $a_i$ is an image matching degree of a partial image with one, with higher matching degree, of images in the defective capacitor image library; and $S_i$ is a score of the partial image corresponding to one, with higher matching degree, of images in a defective capacitor image library.

In the above preferred solution, defective capacitors can be quickly and effectively rejected, and it can be known that what specific defects do the rejected capacitors have, such as cracking, bubbling and scratching.

In which: 1 carrier; 11 clamping hole; 12 elastic layer; 2 capacitor; 3 conveying means; 31 connecting plate; 4 upper image collection assembly; 5 lower image collection assembly; 6 performance testing circuit board; 7 image collector; 8 rejection assembly; 9 light source assembly; 10 adjustment assembly; 101 enclosure; 102 alarm device; 103 display; 104 switch button; 105 keyboard console; 61 testing adsorption plate; 62 positioning hole; and 63 adsorption terminal.

DETAILED DESCRIPTION

Preferred embodiments of the present invention will be illustrated in detail below in conjunction with accompanying drawings.

Figure 1:
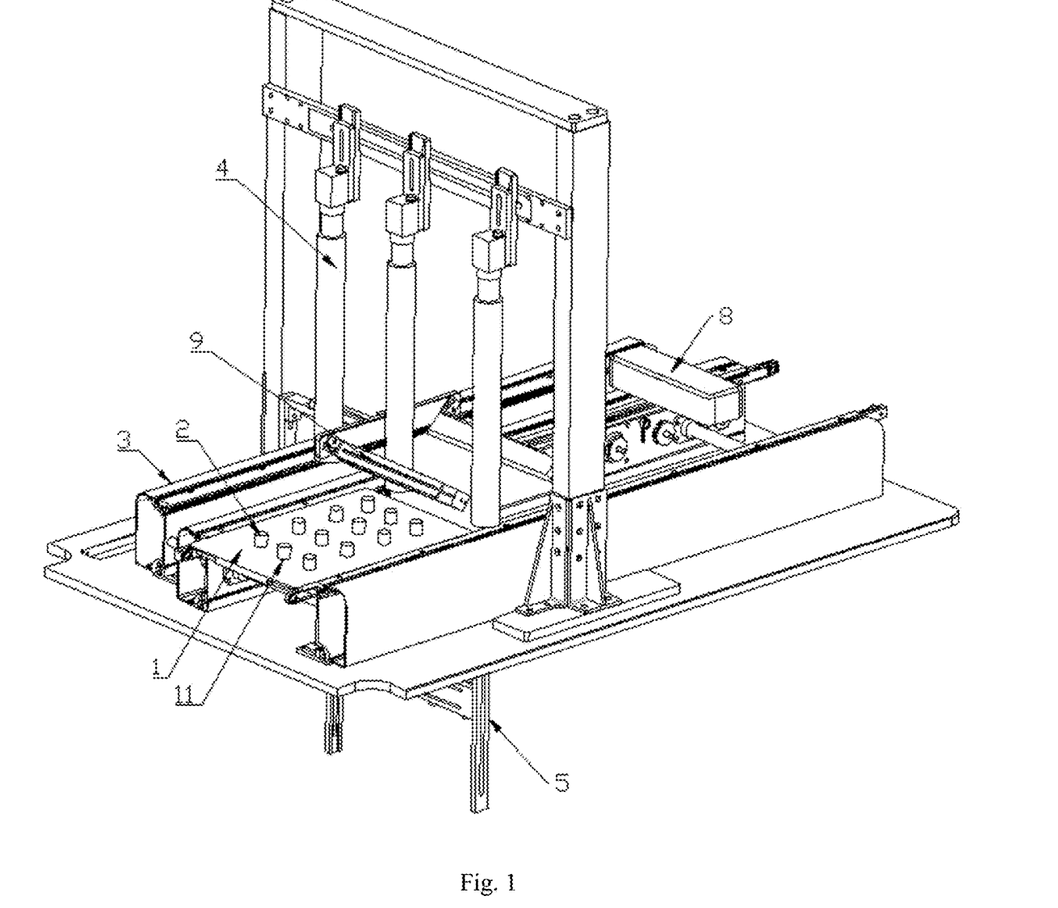
FIG. 1 is a first structural schematic diagram of a capacitor testing device according to embodiments of the present invention.
Figure 3:
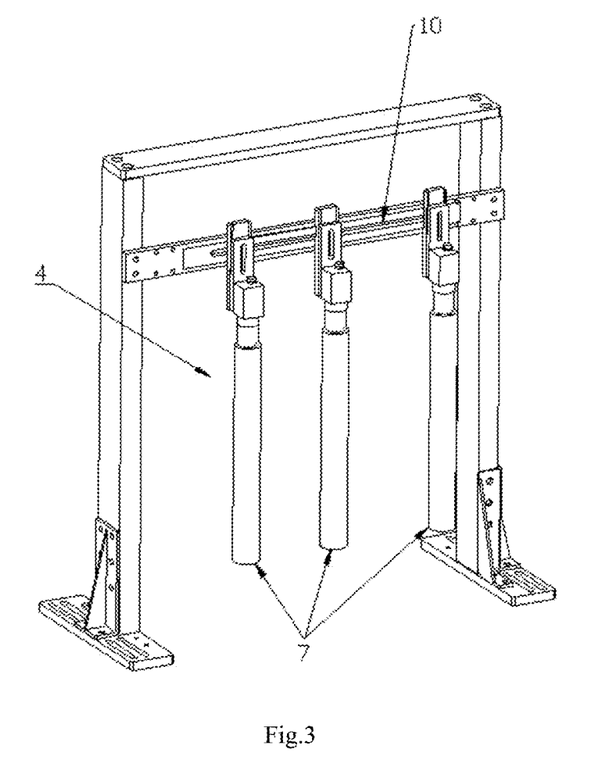
FIG. 3 is a structural schematic diagram of an upper image collection assembly according to embodiments of the present invention.
Figure 4:
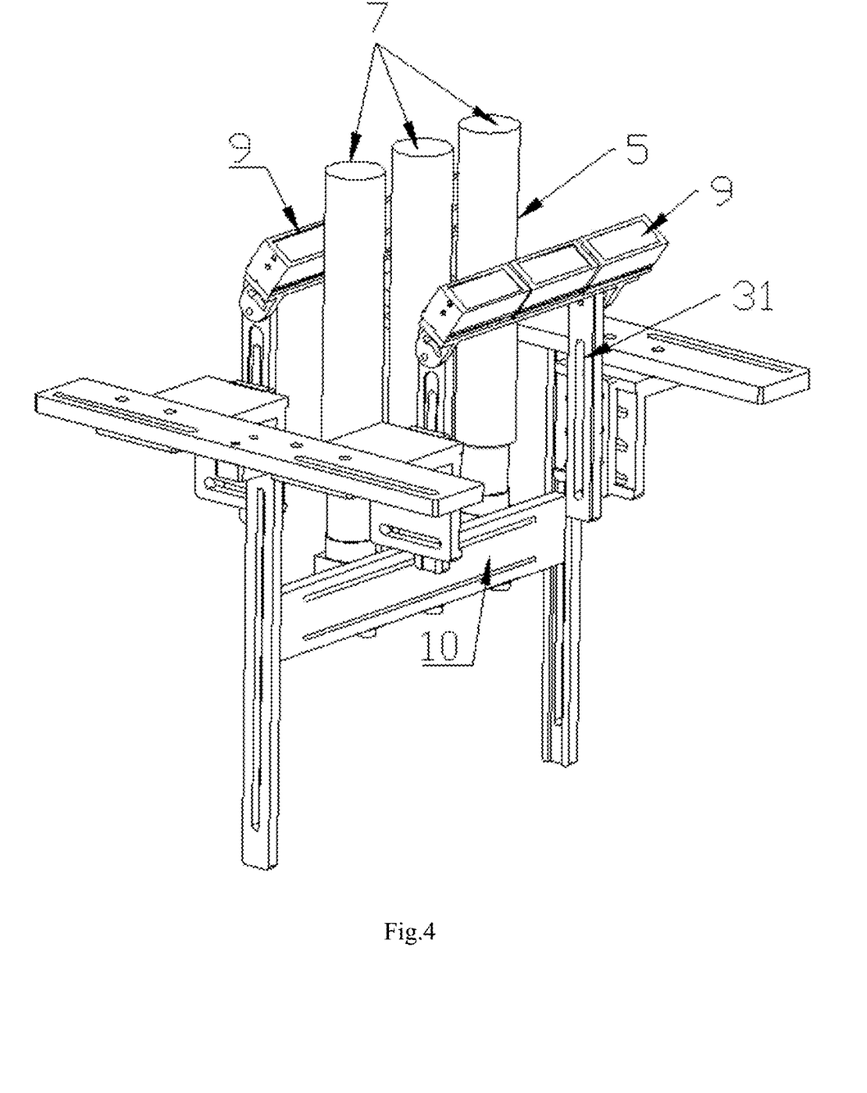
FIG. 4 is a structural schematic diagram of a lower image collection assembly and light source assemblies according to embodiments of the present invention.

To achieve the objective of the present invention, in some of the embodiments of the capacitor testing device and testing method thereof, as shown in FIGS. 1, 3 and 4, the capacitor testing device includes:

a carrier 1 with a plurality of clamping holes 11 which are configured to carry capacitors 2 to be tested;

a conveying means 3 being configured to convey the carrier 1;

an image collection assembly, including an upper image collection assembly 4 disposed above the conveying means 3 and a lower image collection assembly 5 disposed below the conveying means 3, the upper image collection assembly 4 and the lower image collection assembly 5 being configured to perform defect testing on outer surfaces of the capacitors 2 to be tested; and a performance testing means, including a performance testing circuit board 6 and a lifting assembly (not shown in the figure) being configured to drive the performance testing circuit board 6 to ascend or descend, and the performance testing means being configured to test electrical performances of the capacitors 2 to be tested.

The capacitor testing device disclosed by the present invention is simple in structure and convenient to operate, and can quickly and effectively test the electrical performances (such as including whether there is electric leakage, whether there is short circuit, and specific capacitance values) of the capacitors and the surfaces of the capacitors. In addition, the testing process is semi-automated or automated, which reduces manual intervention and labor force, and improves testing precision and testing speed.

Figure 2:
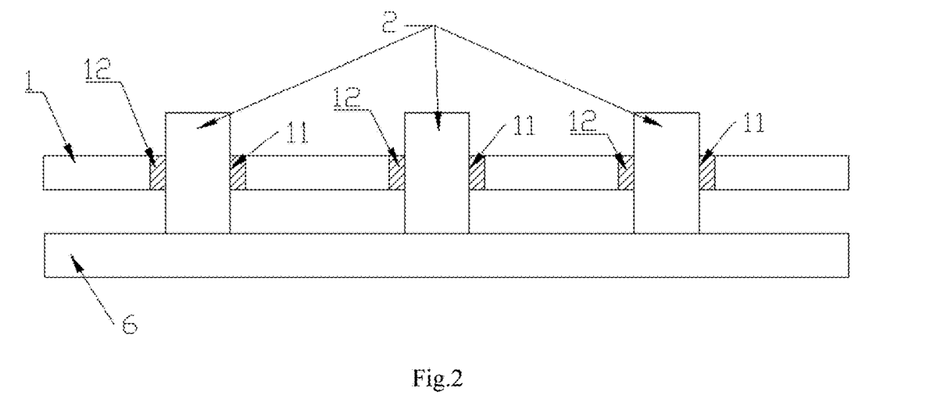
FIG. 2 is a first section view of a carrier and a performance testing circuit board according to embodiments of the present invention.

The present invention further discloses a capacitor testing method using the capacitor testing device, specifically including the following steps:

1) arranging capacitors 2 to be tested in the clamping holes 11 of the carrier 1 one by one;

2) arranging the carrier 1 on the conveying means 3;

3) conveying, by the conveying means 3, the carrier 1 to a testing work position;

4) driving, by the lifting assembly, the performance testing circuit board 6 to ascend until testing contacts on the performance testing circuit board 6 contact the capacitors 2 to be tested on the carrier 1, and testing, by the performance testing circuit board 6, electrical performances of the capacitors 2, as shown in FIG. 2;

5) after completion of testing of the electrical performances, driving, by the lifting assembly, the performance testing circuit board 6 to return to its original position;

6) performing, by the upper image collection assembly 4 and the lower image collection assembly 5, defect testing simultaneously on outer surfaces of the capacitors 2 to be tested; and 7) after completion of the defect testing, conveying, by the conveying means 3, the carrier 1 to a subsequent work position.

The capacitor testing method according to the present invention has simple operation steps, is high in testing precision and testing speed, is suitable for testing a large quantity of capacitors, and substantially reduces manual labor force.

In order to further optimize implementation effects of the present invention, in some other embodiments, the remaining technical features are the same, and the difference lies in that twelve clamping holes 11 are distributed in a matrix on the carrier 1, with four rows, each of which is provided with three clamping holes 11.

In the above preferred solution, the testing effect is better. Meanwhile, in other embodiments, an elastic layer 12 may be attached to inner walls of the clamping holes 11 to protect the outer surfaces of the capacitors.

Further, on the basis of the previous embodiment, each of the upper image collection assembly 4 and the lower image collection assembly 5 includes three image collectors 7 disposed in a row, and the number of the image collectors 7 in the upper image collection assembly 4 and the number of the image collectors 7 of the lower image collection assembly 5 are the same as the number of one row of clamping holes 11 on the carrier 1, the number being 3.

With the above preferred solution, defect testing can be performed on the upper and lower of one row of capacitors simultaneously, with high testing precision and testing speed.

According to the above technical contents, each of the upper image collection assembly 4 and the lower image collection assembly 5 includes three image collectors 7 disposed in a row, the number of the image collectors 7 in the upper image collection assembly 4 and the number of the image collectors 7 of the lower image collection assembly 5 are the same as the number of one row of clamping holes 11 on the carrier 1, and each image collector 7 has its unique code; and step 6) of the capacitor testing method is specifically as follows:

6.1) performing, by the upper image collection assembly 4 and the lower image collection assembly 5, image collection simultaneously on outer surfaces of 3 capacitors 2 to be tested of one row;

6.2) binding, by each of the image collectors 7, its own code with a collected original image, and sending the bound image to a processor;

6.3) positioning and segmenting, by the processor, the original image according to code information to extract partial images of a capacitor 2 to be tested;

6.4) matching, by the processor, the partial images of the capacitor to be tested with images in a non-defective capacitor image library one by one;

if one of the images is successfully matched, determining that the capacitor is non-defective; and if none of the images is successfully matched, determining that the capacitor is defective, and proceeding to step 6.5);

6.5) matching, by the processor, the partial images of the capacitor to be tested with images in a defective capacitor image library one by one to determine that the partial images have higher matching degrees with which one or more images in the defective capacitor image library and as well as the corresponding image matching degree(s); and 6.6) obtaining, by the processor, a defect testing score according to the formula below:

$$C=100-(a1*S1+\ldots+ai*S1+\ldots aj*S1)-\ldots\\-(a1*Si+\ldots+ai*Si+\ldots aj*Si)-(a1*Sn+\ldots\\+ai*Sn+\ldots aj*Sn);$$

wherein ai is an image matching degree of a partial image with one, with higher matching degree, of images in the defective capacitor image library; and Si is a score of the partial image corresponding to one, with higher matching degree, of images in a defective capacitor image library.

In the above preferred solution, defective capacitors can be quickly and effectively rejected, and it can be known that what specific problems do the rejected capacitors have, such as cracking, bubbling and scratching. Moreover, defect testing scores of the capacitor can be effectively obtained to give a user references that whether the capacitor can be used unceasingly or is directly scrapped.

After 3 capacitors of one row are tested, the conveying means 3 drives the carrier 1 to move a step forward to test 3 capacitors of subsequent row, until ending of testing on all the capacitors on the carrier 1.

In order to understand the invention more clearly, the following specific experiment is taken as an example, assuming that three image collectors 7 (whose numbers are 001, 002 and 003 respectively) collect three capacitor images respectively, specifically:

a capacitor image 1;

a capacitor image 2; and a capacitor image 3;

the processor positions and segments the original image according to code information to extract partial images of the capacitors 2 to be tested, specifically:

a partial capacitor image 1;

a partial capacitor image 2; and a partial capacitor image 3.

The processor matches the partial images of the capacitors to be tested with images in a non-defective capacitor image library storing one by one, the non-defective capacitor image library storing 3 images;

The partial capacitor image 1 is successfully matched, the capacitor is non-defective;

The partial capacitor image 2 is successfully matched with none of the images, the capacitor is defective; and The partial capacitor image 3 is successfully matched with none of the images, the capacitor is defective.

The processor matches the partial capacitor image 2 and the partial capacitor image 3 of the capacitors to be tested with images in a defective capacitor image library one by one to determine that each of the partial images 2 and 3 has higher matching degrees with which 2 images in the defective capacitor image library as well as matching degrees with the corresponding images; and the defective capacitor image library stores 4 images, respectively a bubbling image, a scratching image, a cracking image and a breakage image respectively corresponding to the following scores:

the bubbling image, 9 scores;
the scratching image, 4 scores;
the cracking image, 7 scores; and
the breakage image, 10 scores.

The partial capacitor image 2 has the highest matching degrees with the bubbling image and the breakage image, respectively 0.9 and 0.6.

The partial capacitor image 3 has the highest matching degrees with the cracking image and the scratching image, respectively 0.7 and 0.7.

The processor obtains defect testing scores according to the formula below:

$$C=100-(a1*S1+\ldots+ai*S1+\ldots aj*S1)-\ldots\\-(a1*Si+\ldots+ai*Si+\ldots aj*Si)-(a1*Sn+\ldots\\+ai*Sn+\ldots aj*Sn);$$

specifically:

capacitor 2: $C2=100-(0.9*9)-(0.6*10)=85.9$;

capacitor 3: $C3=100-(0.7*7)-(0.7*4)=92.3$.

The user can set a desired threshold, and the capacitor is reserved if the testing score is more than 90, or is directly scraped if the testing score is less than 90. The defect testing score of the capacitor is obtained to give the user references that whether the capacitor can be used unceasingly or is directly scraped.

Further, on the basis of the previous embodiment, the capacitor testing device further includes a rejection assembly 8 being configured to reject a defective tested capacitor; and the rejection assembly 8 includes a rejection mechanical arm, an adsorption plate (not shown in the figure) disposed on the rejection mechanical arm and one or more adsorption holes (not shown in the figure) formed on the adsorption plate, and the adsorption holes communicating with a vacuumizing means through an adsorption channel inside the adsorption plate, and the rejection mechanical arm being configured to drive actions of the adsorption plate.

In the above preferred solution, the rejection mechanical arm drives actions of the adsorption plate, and defective capacitors are adsorbed for rejection through the adsorption holes.

Further, on the basis of the previous embodiment, when the adsorption plate is provided with a plurality of adsorption holes, the plurality of adsorption holes are disposed in a row, and the number of the adsorption holes is the same as the number of one row of clamping holes 11 on the carrier 1, the number being 3.

In the above preferred solution, a plurality of adsorption channels are disposed inside the adsorption plate, each adsorption channel is provided with a valve being configured to open and close the adsorption channel. Each adsorption hole communicates with the vacuumizing means through an adsorption channel corresponding thereto inside the adsorption plate. When a certain capacitor needs to be rejected, the valve of the corresponding adsorption channel is opened, and the capacitor is adsorbed for rejection through the corresponding adsorption hole.

In order to further optimize implementation effects of the present invention, in some other embodiments, the remaining technical features are the same, and the difference lies in that the capacitor testing device further includes light source assemblies 9 being configured to illuminate the capacitors to be tested; and the light source assemblies 9 are disposed on two sides of the upper image collection assembly 4 and/or the lower image collection assembly 5.

In the above preferred solution, the light source assemblies 9 provide light sources to ensure the accuracy of capacitor image collection.

Further, on the basis of the previous embodiment, the conveying means 3 is provided with connecting plates 31 rotatably connected with the light source assemblies 9.

In the above preferred solution, the light source assemblies 9 can be effectively and stably fixed, and meanwhile, angles of the light assemblies 9 are adjustable to provide sufficient illumination for the image collection assembly, so as to accurately collect images.

In order to further optimize implementation effects of the present invention, in some other embodiments, the remaining technical features are the same, and the difference lies in that each of the upper image collection assembly 4 and the lower image collection assembly 5 is disposed on an adjustment assembly 10, and the adjustment assemblies 10 adjust the upper, lower, left and right positions of the upper image collection assembly 4 and lower image collection assembly 5.

With the above preferred solution, the upper, lower, left and right positions of the upper image collection assembly 4 and lower image collection assembly 5 can be effectively adjusted to ensure that the upper image collection assembly 4 and the lower image collection assembly 5 can accurately collect images.

Figure 5:
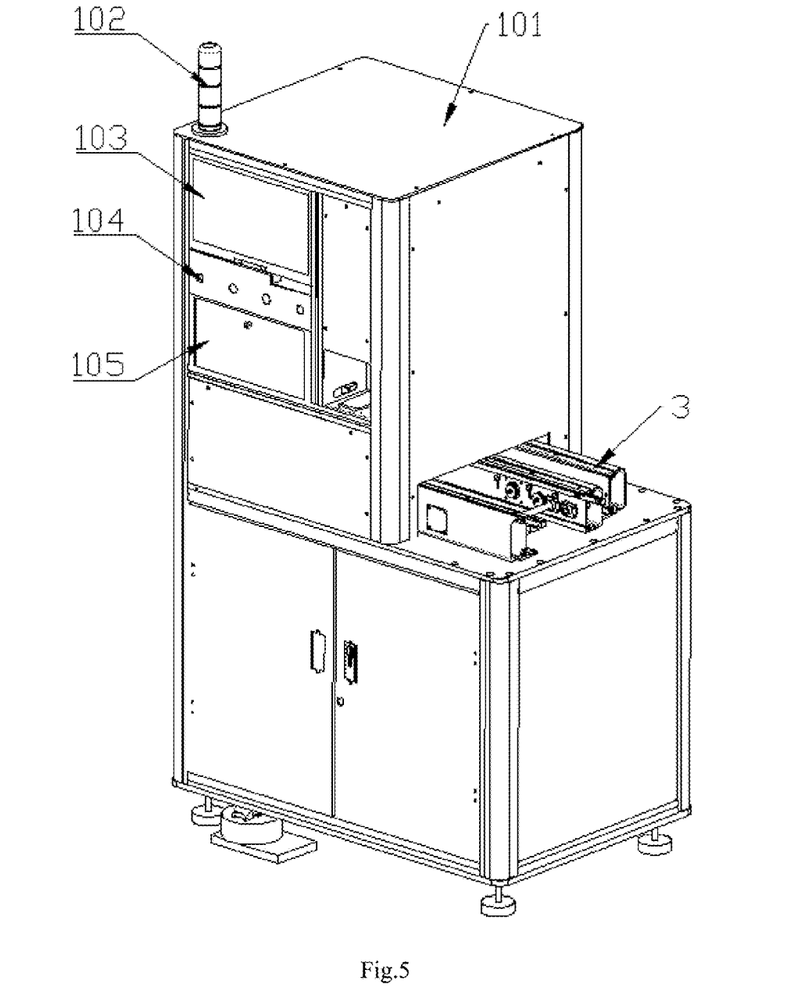
FIG. 5 is a second structural schematic diagram of a capacitor testing device according to embodiments of the present invention.

In order to further optimize implementation effects of the present invention, in some other embodiments, the remaining technical features are the same, and the difference lies in that, as shown in FIG. 5, the capacitor testing device further includes an enclosure 101, and the above components are all disposed inside the enclosure 101 to prevent external debris, dust or water from contaminating the image collection assembly and the light source assemblies, thereby prolonging the overall service life of the device. An alarm device 102, a display 103, a switch button 104 and a keyboard console 105 are also provided outside the enclosure, such that the capacitor testing device is more user-friendly.

Figure 6:
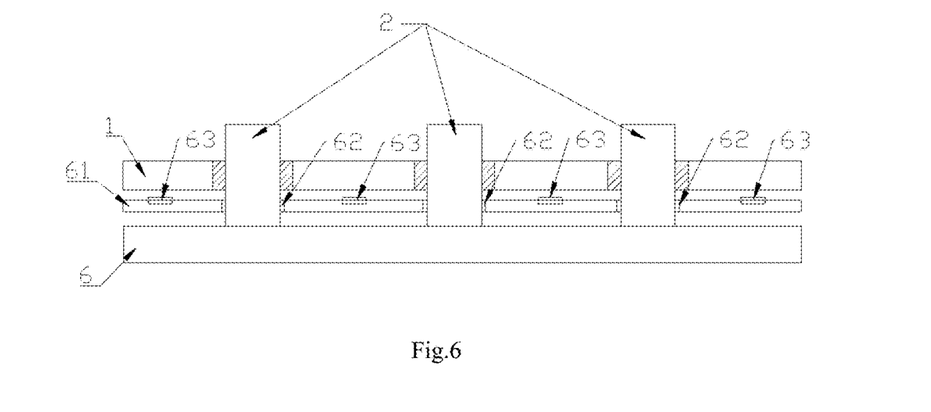
FIG. 6 is a second section view of a carrier and a performance testing circuit board according to embodiments of the present invention.

In order to further optimize implementation effects of the present invention, in some other embodiments, the remaining technical features are the same, and the difference lies in that, as shown in FIG. 6, the capacitor testing device further includes a testing adsorption plate 61 and a drive assembly (not shown in the figure) in transmission connection with the testing adsorption plate 61, the testing adsorption plate 61 being provided with positioning holes 62 matched with the plurality of clamping holes 11, and the testing adsorption plate 61 being provided with a plurality of adsorption terminals 63 connected with an outer vacuumizing means.

Before the action of the performance testing means, the drive assembly drives the testing adsorption plate 61 to get close to the carrier 1, the positioning holes 62 pass through the corresponding capacitors 2 to be tested, and the adsorption terminals 63 provide a certain adsorption force for the carrier 1. Then, the lifting assembly drives the performance testing circuit board 6 to ascend until testing contacts on the performance testing circuit board 6 contact the capacitors 2 to be tested on the carrier 1, and electrical performances of the capacitors 2 are tested by the performance testing circuit board 6; and after completion of testing of the electrical performances, the lifting assembly drives the performance testing circuit board 6 to return to its original position. The testing is preciser.

For the preferred embodiments of the present invention, it should be noted that a number of transformations and improvements can be made without departing from the creative conception of the present invention for a person of ordinary skill in the art, and these transformations and improvements are all within the protection scope of the present invention.

The invention claimed is:

1. A capacitor testing device, comprising:
a carrier with a plurality of clamping holes which are configured to carry capacitors to be tested;
a conveying means being configured to convey the carrier;
an image collection assembly, comprising an upper image collection assembly disposed above the conveying means and a lower image collection assembly disposed below the conveying means, the upper image collection assembly and the lower image collection assembly being configured to perform defect testing on outer surfaces of the capacitors to be tested; and
a performance testing means, comprising a performance testing circuit board and a lifting assembly being configured to drive the performance testing circuit board to ascend or descend, and the performance testing means being configured to test electrical performances of the capacitors to be tested.

2. The capacitor testing device according to claim 1, wherein the clamping holes are distributed in a matrix on the carrier.

3. The capacitor testing device according to claim 2, wherein each of the upper image collection assembly and the lower image collection assembly comprises a plurality of image collectors disposed in a row, and the number of the image collectors in the upper image collection assembly and the number of the image collectors of the lower image collection assembly are the same as the number of one row of clamping holes on the carrier.

4. The capacitor testing device according to claim 3, further comprising a rejection assembly being configured to reject a defective tested capacitor, and
wherein the rejection assembly comprises a rejection mechanical arm, an adsorption plate disposed on the rejection mechanical arm and one or more adsorption holes formed on the adsorption plate, and the adsorption holes communicating with a vacuumizing means through an adsorption channel inside the adsorption plate, and the rejection mechanical arm being configured to drive actions of the adsorption plate.

5. The capacitor testing device according to claim 4, wherein when the adsorption plate is provided with a plurality of adsorption holes, the plurality of adsorption holes are disposed in a row, and the number of the adsorption holes is the same as the number of one row of clamping holes on the carrier.

6. The capacitor testing device according to claim 1, further comprising light source assemblies being configured to illuminate capacitors to be detected, and
wherein the light source assemblies are disposed on two sides of the upper image collection assembly and/or the lower image collection assembly.

7. The capacitor testing device according to claim 6, wherein the conveying means is provided with connecting plates rotatably connected with the light source assemblies.

8. The capacitor testing device according to claim 1, wherein each of the upper image collection assembly and the lower image collection assembly is disposed on an adjustment assembly, and the adjustment assemblies being configured to adjust the upper, lower, left and right positions of the upper image collection assembly and lower image collection assembly.

9. A capacitor testing method using the capacitor testing device according to claim 1 to perform testing, specifically comprising the following steps:
1) arranging capacitors to be tested in the clamping holes of the carrier one by one;
2) arranging the carrier on the conveying means;
3) conveying, by the conveying means, the carrier to a testing work position;
4) driving, by the lifting assembly, the performance testing circuit board to ascend until testing contacts on the performance testing circuit board contact the capacitors to be tested on the carrier, and testing, by the performance testing circuit board, electrical performances of the capacitors;
5) after completion of testing of the electrical performances, driving, by the lifting assembly, the performance testing circuit board to return to an original position;
6) performing, by the upper image collection assembly and the lower image collection assembly, defect testing simultaneously on outer surfaces of the capacitors to be tested; and
7) after completion of the defect testing, conveying, by the conveying means, the carrier to a subsequent work position.

10. The capacitor testing method according to claim 9, wherein each of the upper image collection assembly and the lower image collection assembly comprises a plurality of image collectors disposed in a row, the number of the image collectors in the upper image collection assembly and the number of the image collectors of the lower image collection assembly are the same as the number of one row of clamping holes on the carrier, and each of the image collectors has its unique code;
step 6) is specifically as follows:
6.1) performing, by the upper image collection assembly and the lower image collection assembly, image collection simultaneously on outer surfaces of the capacitors to be tested;
6.2) binding, by each of the image collectors, its own code with a collected original image, and sending the bound image to a processor;
6.3) positioning and segmenting, by the processor, an original image according to code information to extract partial images of a capacitor to be tested;

6.4) matching, by the processor, the partial images of the capacitor to be tested with images in a non-defective capacitor image library one by one;
if one of the images is successfully matched, determining that the capacitor is non-defective; and
if none of the images is successfully matched, determining that the capacitor is defective, and proceeding to step 6.5);
6.5) matching, by the processor, the partial images of the capacitor to be tested with images in a defective capacitor image library one by one to determine that the partial images have higher matching degrees with which one or more images in the defective capacitor image library and as well as the corresponding image matching degree(s); and
6.6) obtaining, by the processor, a defect testing score according to the formula below:

$$C=100-(a1*S1+\ldots+ai*S1+\ldots aj*S1)-\ldots -(a1*Si+\ldots+ai*Si+\ldots aj*Si)-(a1*Sn+\ldots +ai*Sn+\ldots aj*Sn);$$

wherein $ai$ is an image matching degree of a partial image with one, with higher matching degree, of images in the defective capacitor image library; and
$Si$ is a score of the partial image corresponding to one, with higher matching degree, of images in a defective capacitor image library.

* * * * *